United States Patent [19]
Flint

[11] Patent Number: 5,734,766
[45] Date of Patent: Mar. 31, 1998

[54] HIGH EFFICIENCY FIBER OPTIC COUPLER THAT REDUCES BEAM DIVERGENCE

[75] Inventor: Graham W. Flint, Albuquerque, N. Mex.

[73] Assignee: Laser Power Corporation, San Diego, Calif.

[21] Appl. No.: 642,305

[22] Filed: May 3, 1996

[51] Int. Cl.⁶ ............................................. G02B 6/26
[52] U.S. Cl. ................................ 385/43; 385/48; 385/42
[58] Field of Search ............................ 385/43, 41–48

[56] References Cited

U.S. PATENT DOCUMENTS

| | | | |
|---|---|---|---|
| 4,688,884 | 8/1987 | Scifres et al. | 350/96.15 |
| 4,820,010 | 4/1989 | Scifres et al. | 350/96.15 |
| 5,081,639 | 1/1992 | Snyder et al. | 372/101 |
| 5,127,068 | 6/1992 | Baer et al. | 385/34 |
| 5,168,401 | 12/1992 | Endriz | 359/625 |
| 5,293,269 | 3/1994 | Burkhart et al. | 359/719 |

*Primary Examiner*—Phan T. H. Palmer
*Attorney, Agent, or Firm*—Knobbe, Martens, Olson & Bear, LLP

[57] ABSTRACT

A fiber optic coupler for coupling an asymmetrical beam such as provided by a laser diode into a fiber optic cable. The coupler comprises at least one fiber optic cable having a first end including a tapered section that has an approximately flat coupling facet for receiving the asymmetrical beam and an approximately flat tapered surface adjacent to the coupling facet for reflecting the rapidly diverging radiation, a main body for receiving and transmitting the reflected laser radiation, and an output end having an approximately flat output facet. A support structure situates the coupling facet proximate to the laser diode. A second, approximately flat tapered surface may be formed in the tapered section opposite the first tapered surface. The fiber optic cable may have any cross-section, such as circular, rectangular, or square. The coupler is particularly useful for coupling multiple output beams from a laser diode array into a plurality of fibers that are collected on their output ends to approximate a single beam, which can be then applied to end-pump a solid state laser.

51 Claims, 6 Drawing Sheets

HIGH EFFICIENCY FIBER OPTIC COUPLER THAT REDUCES BEAM DIVERGENCE

BACKGROUND OF THE INVENTION

1. Field of the Invention

The present invention relates to fiber optic couplers for coupling a beam of electromagnetic radiation into a fiber optic cable, and more specifically to a coupler for coupling the rapidly diverging laser beam from a laser diode into a fiber optic cable with high efficiency.

2. Description of the Related Art

A laser diode is a semiconductor device that emits laser radiation from a slit-like output aperture in response to an applied current. A laser diode may comprise a single output, or for high power uses, an array of laser diodes can provide multiple beams from multiple output apertures of a laser diode bar. Laser diodes are a particularly efficient source of laser radiation.

It is often advantageous to couple the laser radiation emitted from a laser diode or laser diode array through some type of fiber optic assembly to a remote location. For example, such coupling can be for the purpose of pumping a laser device or for any purpose wherein it is desired to transfer the output power of the laser diode to a remote point, such as applications involving illumination, metal processing and laser surgery. When multiple outputs are involved, the task of bringing all of the emitted light to a compact spot is complicated by the extent to which the individual emitters are geometrically spread along the length of the laser diode bar.

Coupling laser radiation from a laser diode into a fiber optic cable can be difficult because the output characteristics differ significantly from those of gas or bulk solid state lasers insofar as the laser diode beam emerges from an exit aperture which is slit-like. For example, the dimensions of such exit apertures may be 200 microns by 1 micron, and therefore, the angular divergence of the emerging beam is far greater in one axis than in the other. For example, while the total angle of divergence in the "slow" axis may be only a few degrees, that in the "fast" axis may approach 90°. To reduce the divergence of such asymmetric beams, a variety of optical systems have been used, depending upon the use to which the laser beam is put.

Some straightforward approaches employ aspheric cylindrical lenses. For example, Burkhart et al. (U.S. Pat. No. 5,293,269) describes an aspheric cylindrical lens for collimating, with low optical aberrations, the asymmetrically diverging beams of diode laser arrays. Although disclosed in the context of diode laser arrays, this technique is highly applicable to single emitters.

An approach specifically directed toward arrays is described by Snyder et al. (U.S. Pat. No. 5,081,639), which discloses a diffraction limited, high numerical aperture cylindrical microlens that is physically attached to the diode array itself. Baer, in U.S. Pat. No. 5,127,068, describes a means for using a small diameter multimode optical fiber with a low numerical aperture as a microlens to collimate the output emissions of a laser diode before butt coupling the output of the laser diode to an optical fiber.

A microlens/reflector device is described by Endriz in U.S. Pat. No. 5,168,401. Endriz discloses a complex system that includes an array of prism structures to carry out rotational transformation. Endriz discloses that his optical system can be used in conjunction with a one- or two-dimensional array of high brightness sources where such sources are individually rotated by multiple reflective elements.

Scifres et al., in U.S. Pat. No. 4,688,884, discloses a fiber optic coupling system comprising a phased array semiconductor laser and a multimode light transmitting fiber having a squashed input end. In U.S. Pat. No. 4,820,010, Scifres et al. describe the same squashed fiber in the context of producing bright light output for optical pumping, communications, illumination and the like in which one or more optical waveguides receive light from one or more diode lasers or diode laser bars and transmit the light to an output end where it is focused or collimated into a bright light image.

The Scifres et al. patent illustrates that squashing the end of the fiber causes the cross-section of the fiber end to approximate an ellipse, the major axis of which is larger than the diameter of the continuing fiber, and the minor axis of which is smaller than that diameter. As a consequence, the numerical aperture (NA) of light radiation entering the squashed end of the fiber along the minor axis is decreased, while the NA of light entering along the major axis is increased which disadvantageously increases its divergence. Particularly, in a plane which lies perpendicular to the long axis of the diode array, the coupled radiation encounters the minor axis of the elliptical fiber end, which causes the numerical aperture associated with the radiation to decrease via multiple reflections as it propagates toward the cylindrical continuation of the fiber. In this manner, the large numerical aperture exhibited in this axis by diode lasers is effectively reduced so as to permit coupling to a fiber of lower numerical aperture. Along the orthogonal axis, the reverse occurs, as the progressively increasing angle of the neck of the squashed fiber increases the numerical aperture of the diode emission (i.e., increases its divergence) as it propagates toward the cylindrical continuation of the fiber, unfortunately reducing brightness and increasing transmission losses. Another disadvantage of Scifres' "squashed fiber" approach is that the beams' divergence is affected in a very nonsymmetrical manner. For example, at the edges of the ellipse, the divergence is modified very differently than in the middle section.

SUMMARY OF THE INVENTION

The present invention provides a fiber optic coupler for coupling an asymmetrical beam that includes rapidly diverging laser radiation and slowly diverging laser radiation, such as may be provided by a laser diode into a fiber optic cable. The fiber optic coupler reduces the divergence (i.e. reduces the NA) of the beam along the fast axis, and preserves, rather than increases, the beam's low divergence along the slow axis. The coupler comprises at least one fiber optic cable that has a first end including an approximately flat coupling facet for receiving the asymmetrical beam, a tapered section including an approximately flat tapered surface adjacent to said coupling facet for reflecting the rapidly diverging laser radiation, a main body for receiving and transmitting the reflected laser radiation and the slowly diverging laser radiation, and a second, output end that includes an approximately flat output facet that outputs the laser radiation transmitted through the fiber optic cable. A support structure is provided for situating the coupling facet proximate to the laser diode. A second, approximately flat tapered surface may be formed opposite the first tapered surface, and extends from the coupling facet. In some embodiments, the first tapered surface and the second tapered surface may define approximately equal angles with respect to the central axis of the fiber optic cable.

The present invention is particularly useful for an apparatus that couples the multiple output beams from a laser diode array into a plurality of fibers that are brought together on their output ends to approximate a single beam. Each output of the laser diode array provides an asymmetrical beam having a fast axis and a slow axis. Each of the fiber optic cables includes a tapered section that has an approximately flat tapered surface. The support structure situates each of the coupling facets in a first predetermined configuration proximate to the laser diode array, so that the fast axis of each of the plurality of asymmetrical output beams is aligned approximately perpendicular with the flat tapered surface. In one embodiment, the output facets are situated in a closely positioned adjacent relationship within the housing, to provide a collective output beam. A solid state laser is provided including a laser cavity and a solid state gain material situated therein, and the collective beam is applied to end pump the solid state gain material and thereby provide lasing operation of the solid state laser.

Using the coupler described herein, extraordinarily high coupling efficiency, up to 98%, has been achieved. It is believed that the high coupling efficiency results from substantially reducing the beam divergence in the rapidly diverging section. Particularly, wherever the rapidly diverging beam interacts with the tapered surface, the beam's divergence is reduced upon reflection. By positioning the rapidly diverging portion of the beam (termed the "fast" axis) to interact with the flat tapered surface, the divergence is reduced to the taper angle, thereby reducing the numerical aperture of the beam. This reduced divergence (i.e. reduced numerical aperture) has several advantages. The high brightness of the laser output is substantially preserved by reducing the beam divergence along the rapidly diverging axis. Along the slow axis the beam is input between parallel sides, and therefore the relatively low divergence is not increased. Although the increase in brightness caused by reducing beam's divergence is offset by expansion of the beam to fill the fiber's cross-section, the increase in brightness operates to provide a higher quality output beam. For example, the low numerical aperture is particularly useful to efficiently pump solid state gain material.

The coupler is formed on the end of the fiber, so that it is integral with the fiber. By using an integrally-formed coupler, only two components, the tapered section and the laser diode output, need to be precisely aligned to direct and couple light into an optical fiber. Using previous couplers that require a lens in addition to the laser diode and fiber optic cable, three components (the diode laser, the lens fiber and the receiving fiber) were required to be precisely aligned with each other.

In one implemented embodiment, the polarization preservation was measured, and observed to be high. Particularly, in initial testing with a plurality of circular fibers over a distance of about one inch, a 90–95 percent polarization preservation was observed, and furthermore, each of the beams exiting from the fiber output facets exited with the same direction of polarization. A polarized beam can be useful in applications where the beam must be switched by an electro-optic switch, for example. Another use for a polarized beam is for back-lighting an LCD (liquid crystal display).

The fiber optic cable can have any shape, such as circular, elliptical, rectangular or square. In one useful embodiment, the optical fibers comprise a square cross-section that allows them to be closely packed at the output. Furthermore, square fibers are useful for the embodiment in which only a single side is tapered, due to ease of manufacture and high efficiency because one of these sides is already flat. Furthermore, it is believed that the square fiber preserves polarization better than the circular fiber.

BRIEF DESCRIPTION OF THE DRAWINGS

The foregoing, together with other objects, features and advantages of this invention, will become more apparent when referring to the following specification, claims and the accompanying drawings, wherein:

DETAILED DESCRIPTION OF THE PREFERRED EMBODIMENTS

This invention is described in a preferred and alternative embodiments in the following description with reference to the figures, in which like numbers represent the same or similar elements. While this invention is described in terms of best mode for achieving this invention's objectives, it will be appreciated by those skilled in the art that variations may be accomplished in view of these teachings without deviating from the spirit or scope of the invention.

Figure 1:
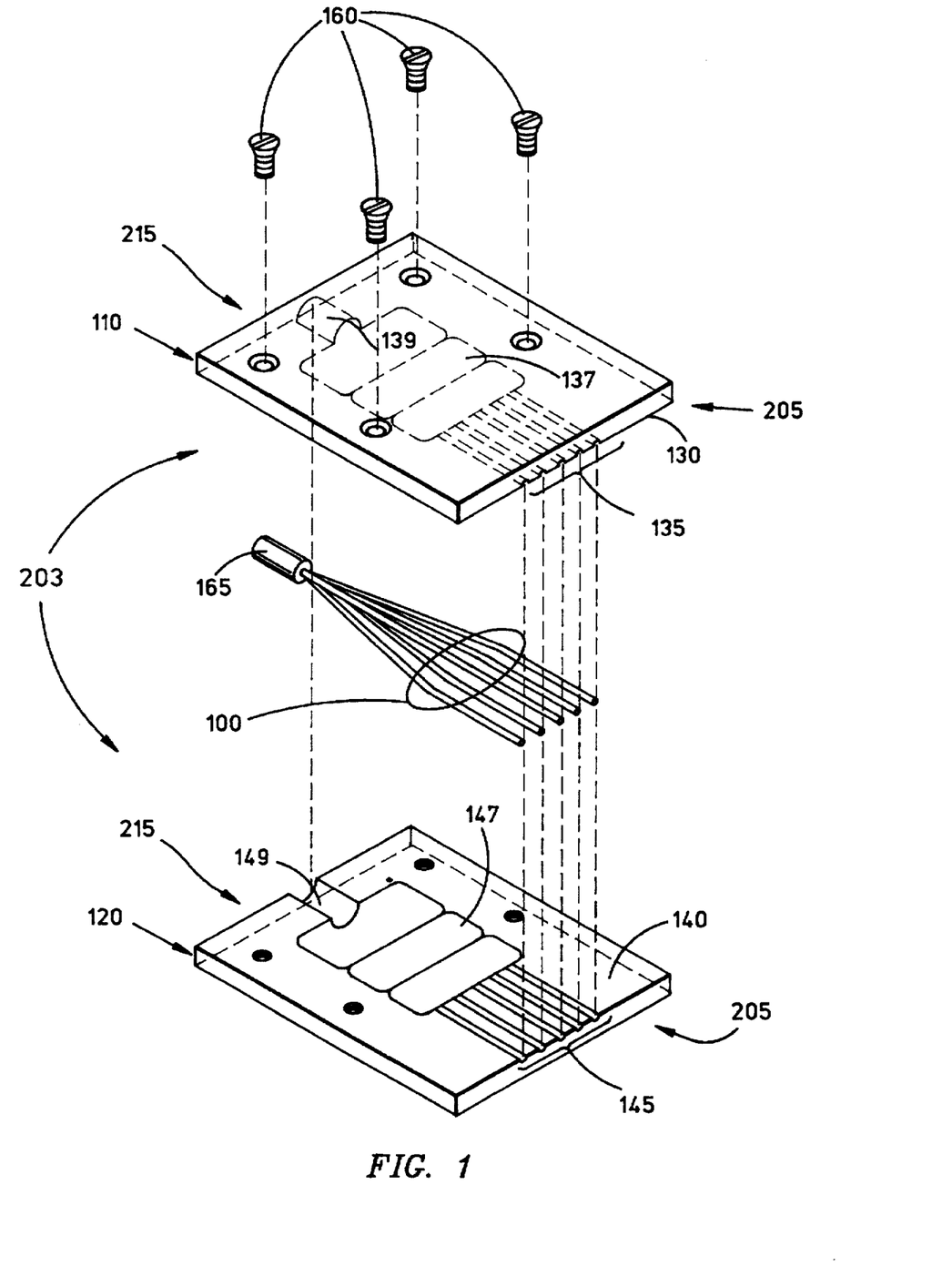
FIG. 1 is an exploded view of a housing and a plurality of fiber optic cables to be positioned therein during manufacturing in accordance with the present invention.

Reference is first made to FIGS. 1-4 to show a preferred method of making the preferred fiber optic coupler of the invention. FIG. 1 is an exploded view of a plurality of fiber optic cables 100 positioned between an upper housing section 110 and a lower housing section 120 that together comprise a housing 203 for the fiber optic cables. The fiber optic cables 100 may comprise any suitable material such as quartz, and preferably, they conventionally include a core encased in a cladding. Each fiber optic cable may have any suitable cross-section, such as circular, elliptical, rectangular or square. A central axis is defined through the center of the cross-section of the fiber optic cable. Each of the fibers may have a small diameter such as about 100 to 300 microns, or a larger diameter such as about 500 to 600 microns. The preferred cross-section is circular and the preferred diameter is between about 100 and 300 microns, which is large enough to receive the full beam width (about 100 to 200 microns) yet small enough to minimize the brightness reduction caused by coupling a relatively smaller cross-section beam into the larger cross-section of the fiber. Another advantage of cylindrical fibers is their low cost, ready availability, and the ease with which they can be positioned and assembled for the purposes described herein. It is believed that a square cross-section is preferable for polarization preservation.

A support structure for the fiber optic cables is provided by a housing that includes the upper and lower housing sections 110 and 120. The housing sections may be constructed of aluminum. However, for the preferred embodiment, the housing is formed of a hard material, such as ceramic, glass, quartz, or a hard metal which materials are chosen to have grinding characteristics similar to those of the fiber optic cable. Particularly, a housing made of such hard materials can facilitate subsequent operations that grind and polish the fiber optic cables to predefined configurations. The upper section 110 comprises an approximately box-like configuration having an inner surface 130 that includes a plurality of grooves 135 extending inwardly from the input side 205 to a hollowed area 137, connected to a half-cylindrical groove 139 between the hollowed area 137 and opposite or output end 215. The inner surface 130 is designed to match a corresponding inner surface 140 on the lower half which also is formed with a plurality of grooves 145 extending inwardly from the input side 205 to a hollow area 147, which is similarly connected to a half-cylindrical groove 149 between the hollow area 147 and opposite or output end 215. The grooves 135 and 145 are each designed to securely hold one of the fiber optic cables 100 in position between them and the hollow areas 137 and 147 are designed to provide unrestricted passage of the fiber optic cables. The cylindrically shaped grooves 139 and 140 are designed to securely hold together the output ends of the cables 100. Preferably, the housing 203 is designed so that path of the fiber optic cables 100 has a minimum of bending angles, thereby minimizing transmission losses.

The upper section 110 and the lower section 120 of the housing are held together by any suitable affixing means, such as screws or bolts 160 that are inserted through suitable holes formed therein. Appropriate adhesives or clamps, among other means could also be used to secure the housing sections together. In order to properly position the bundle of fiber optic cables 100 in its output groove 139, 140, a sleeve 165 may first be inserted over the fiber optic cables. The sleeve with the fibers running therethrough is positioned in the output groove. An epoxy or some other adhesive material is useful to hold the fibers in position at the output ends, and particularly around the sleeve. The adhesive may also be used to hold the fibers at the input ends within the grooves 135, 145, if desired.

Figure 2:
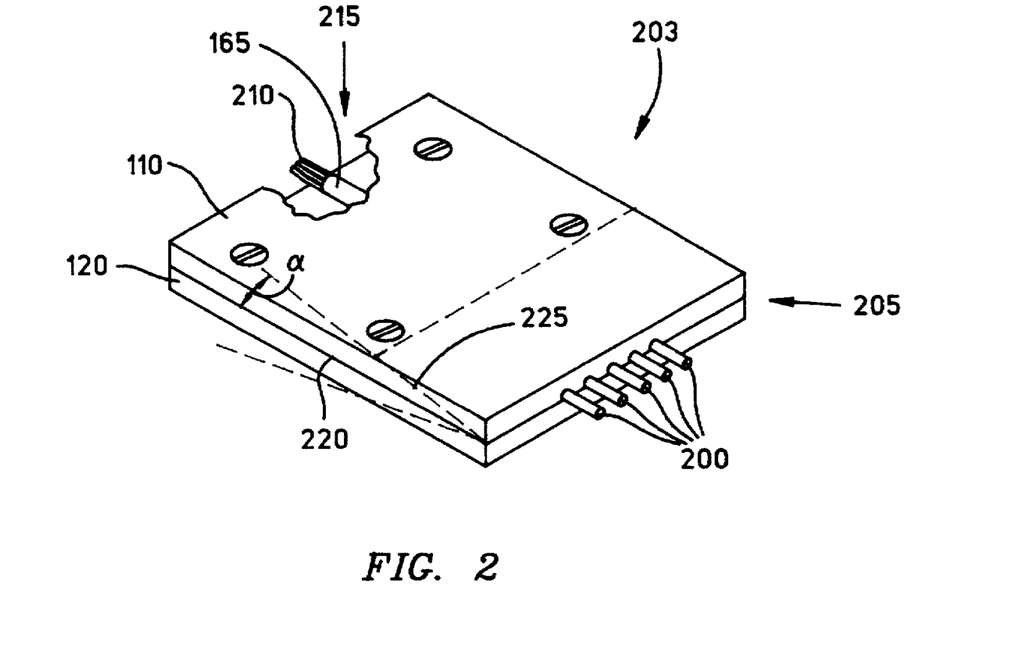
FIG. 2 is an assembled view of the unfinished housing of FIG. 1 with the fiber optic cables positioned therebetween.

Reference is now made to FIG. 2, which is a perspective view of the structure in which the upper section 110 has been assembled to the lower section 120, forming housing 203 with a plurality of fibers 100 enclosed within. The fiber optic cables now include a protruding section 200 extending from input end 205 of the housing, and a plurality of closely positioned protruding ends 210 positioned from the output end 215. Initially, the protruding ends 210 at the output side are cut as closely as possible to the housing. The output ends of the fiber optic cable 210 are then ground and polished to provide a flat output facet on each of the fibers. As a result, the output facets are formed approximately parallel with each other and with the output side of the housing.

Figure 3:
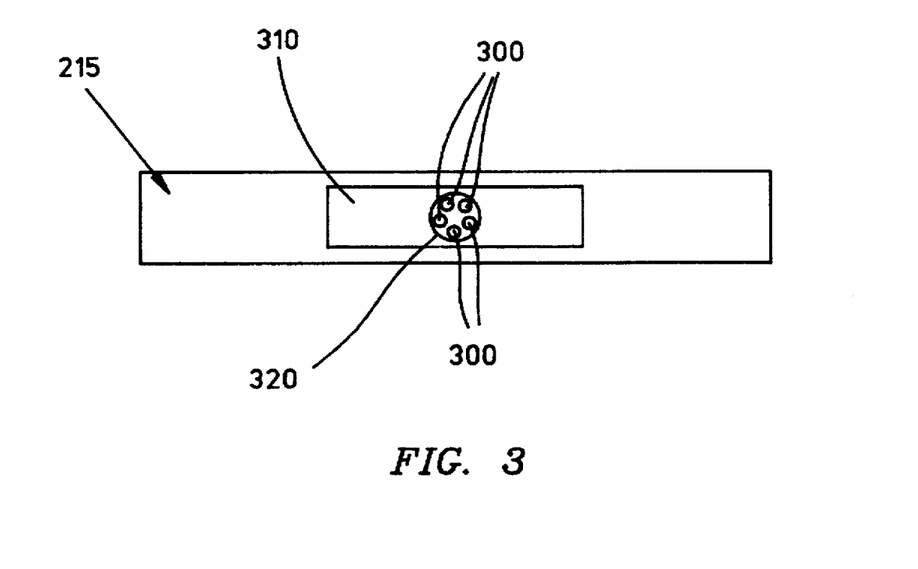
FIG. 3 is a plan view of the output end of the housing of FIG. 2, the end having been polished so that the output facets have a flat smooth surface.

FIG. 3 is a plan view of output end 215 which has been polished so that the output facet 300 of each fiber optic cable provides a smooth flat surface. As shown in FIG. 3 an optional glass plate 310 is utilized on the output end to provide a surface that has grinding characteristics similar to the optical fibers, which facilitates grinding and polishing the output facets 300 to as smooth a surface as possible. The glass plate 310 may be affixed, before grinding, by any suitable means such as a suitable adhesive.

Returning again to FIG. 2, the protruding fiber ends on the input end 200 are cut as closely as possible to the input surface 205 of the housing. An angle, determined by design considerations which will be discussed later herein, is determined. This angle is shown as α and it is defined between the center line 220 between the two housing sections and a dotted line 225 that indicates the final tapered surface of the upper housing that will be thereby formed.

Figure 4:
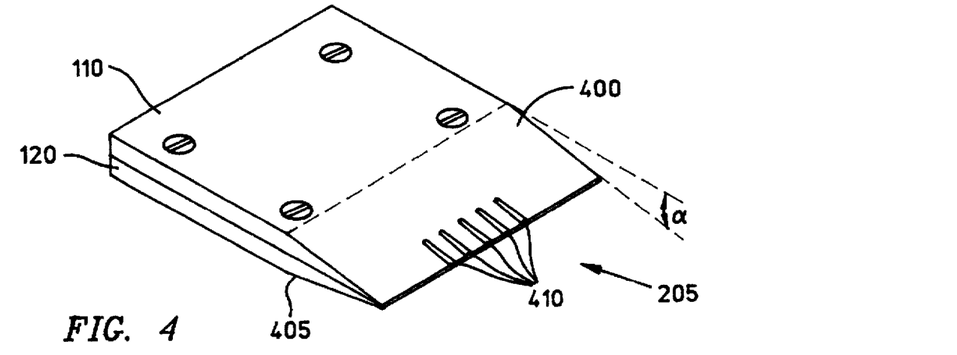
FIG. 4 is a perspective view of a complete, assembled housing of the invention in which the input ends of the fiber optic cables have been tapered.

FIG. 4 is a perspective view of an assembled housing in which the input ends of the fiber optic cables have been tapered according to the specification, utilizing any suitable combination of grinding, polishing and cutting by one skilled in precision grinding and polishing of micro-scale components. The result of these operations is a tapered surface 400 on the upper section 110 and a similarly (but oppositely) tapered surface 405 on the lower section 120. The fiber optic cables, on the input end 205, have tapered sections 410 formed therein at the predefined angle α that include an upper, approximately flat tapered surface 500 and a similar lower, approximately flat, tapered surface 510 as shown in FIG. 5.

In the embodiment described herein, the surface cladding has been removed from the upper and lower tapered surfaces. Without the cladding, the internal reflections from the tapered surface are susceptible to losses due to dirt or other contaminants that may become attached to the surface. In order to avoid exposure to contaminants, the surfaces have been kept as clean as possible, and the couplers are stored and used in a clean environment.

Figure 5:
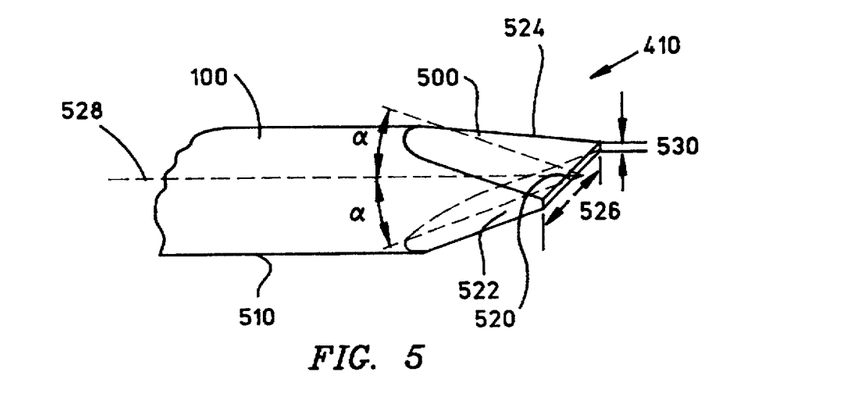
FIG. 5 is an enlarged perspective view of a tapered section of a cylindrical fiber optic cable of the invention, the cable having dual tapers formed in it.

FIG. 5 is an enlarged view of the tapered section 410 shown in FIG. 4. The tapered section includes an upper approximately flat tapered surface 500, a lower approximately flat tapered surface 510, and a flat coupling facet 520 having an approximately rectangular shape formed therein. A first side section 522 and a second side section 524 are defined by unremoved sections of the fiber optic cable between the upper and lower tapered surfaces. Thus, a length 526 of the coupling facet is identical with the diameter of the fiber 100, and the side sections 522 and 524 are approximately parallel to each other. Furthermore, the side sections 522 and 524 are approximately parallel to a central axis 528 that is defined through the center of the fiber's cross-section. The coupling facet has a width 530 predetermined by design constraints of the source that is to be coupled therein, as well as the distance from that source. Preferably, the surfaces 500 and 510 are polished to be as flat as possible. An angle $\alpha$ is defined between each of the tapered sections and a plane that includes the central axis of the fiber. Thus, in the preferred embodiment, forming the tapered section includes forming the first, approximately flat tapered surface 500 extending from the coupling facet at the predetermined angle $\alpha$, and forming the second, approximately flat tapered surface 510 situated approximately opposite the first tapered surface. Preferably, the second tapered surface is also formed at the angle $\alpha$. However, in some embodiments the first and second tapered surfaces may have different angles, or only one side may be formed as a flat tapered surface. In some embodiments, the housing could be tapered before the fibers are affixed thereto in order to minimize the amount of grinding that would be necessary to properly shape the fibers. Examples of alternative embodiments are shown in FIGS. 11–14 and are discussed later.

The method of making the fiber optic coupler described herein is particularly useful for smaller diameter (100–300 micron) fibers. However, for larger diameter fibers (greater than 500 microns), the fibers could be individually tapered and mounted without the necessity of utilizing the housing as described.

Preferably, an anti-reflection (AR) coating is deposited on the coupling facet 520 of the optical fibers. Such a dielectric AR coating is designed to efficiently transmit the wavelength of the beam input through it. One example of such a dielectric coating is a single layer of magnesium fluoride (MgF$_2$). However, in the preferred embodiment the dielectric coating comprises multiple layers of any conventional dielectric material that provides more efficient transmission. Although the AR coating is useful primarily on the coupling facets 520, in actual manufacturing processes the AR coating may spill over onto the adjoining tapered surfaces 500 and 510 without substantial adverse consequences.

In initial testing, polarization preservation, which is the degree to which the polarization of the incoming light is preserved within the fiber, was observed to be high. Particularly, with a plurality of circular fibers over a distance of about one inch, a 90% to 95% preservation of polarization was observed. Furthermore, advantageously all beams exit with the same direction of polarization. The polarization preservation properties may be useful, for example, for use within an electro-optic switch that switches the output beam or any of a number of uses. Another use for a polarized beam is to light an LCD (liquid crystal display) display. Although the circular fibers showed a high degree of polarization preservation, it is believed that the rectangular cross-section would provide an even greater degree of polarization preservation. Therefore, for those uses in which polarization preservation is important, the rectangular cross-section fiber may be particularly useful.

Referring again to FIG. 3, the closely positioned and bundled fibers provide a geometrically compact pupil 320.

At the output facet, each fiber provides a discrete beam that is very closely positioned with beams from adjacent output facets. However, as the beams travel into the far field, the divergence of each individual beam will eventually overlap with its neighbors to provide a single beam. In one embodiment, the collected beams are focused tightly into a solid state laser, and each of the output beams becomes extremely closely positioned at the focal point, approximating a single focused beam. The coupler described herein is particularly useful for coupling light from a laser diode array into a plurality of fiber optic cables and providing an approximately single output beam. Although the following discussion describes the preferred embodiment in terms of a laser diode array, it should also be apparent that the present invention would be useful in a single laser diode, and particularly for coupling the light from the single laser diode into a single optical fiber.

Figure 6:
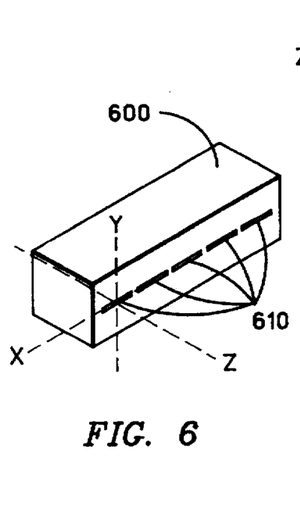
FIG. 6 is a perspective view of a laser diode array in accordance with the present invention, the array comprising a plurality of output surfaces.

Reference is now made to FIG. 6, which is a perspective view of a laser diode array 600 comprising a plurality of output surfaces 610. In operation, each of the surfaces 610 outputs a laser beam. For purposes of the present invention, any type of conventional laser diode is suitable. For example, a conventional laser diode array comprising a plurality of one micron by 200 micron output surfaces has been used. As is well known, each of the output surfaces emits an asymmetrically diverging laser beam. The x-y-z axes shown at one of the output surfaces in FIG. 6 can be used to define the beam emitted therefrom.

Figure 7:
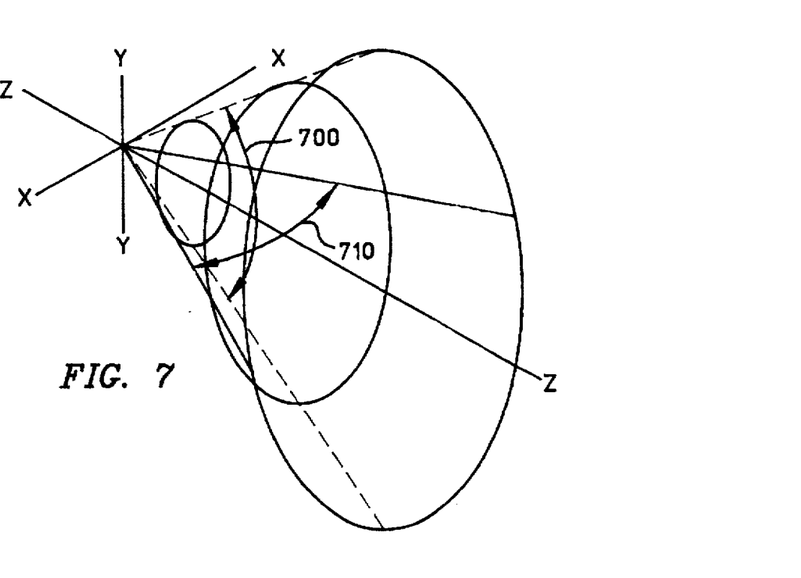
FIG. 7 is a graphical depiction of an output beam from one of the output surfaces of the laser diode array in FIG. 6.

FIG. 7 illustrates a beam emitted from one of the output surfaces 610. Particularly, the y axis of the output surface 610 defines a "fast" axis in which the beam is rapidly diverging, as illustrated in FIG. 7, at an included angle 700 which may be as great as 90°, for example. At the same time, along the x axis, which defines the "slow" axis, the beam may be diverging at a smaller included angle of divergence, as illustrated at 710, which may be only about 5°. In order to couple the output beams into the coupling facets 520 of each coupler, the input end 205 of the housing has a configuration predetermined to match that of the laser diode 600.

Figure 8:
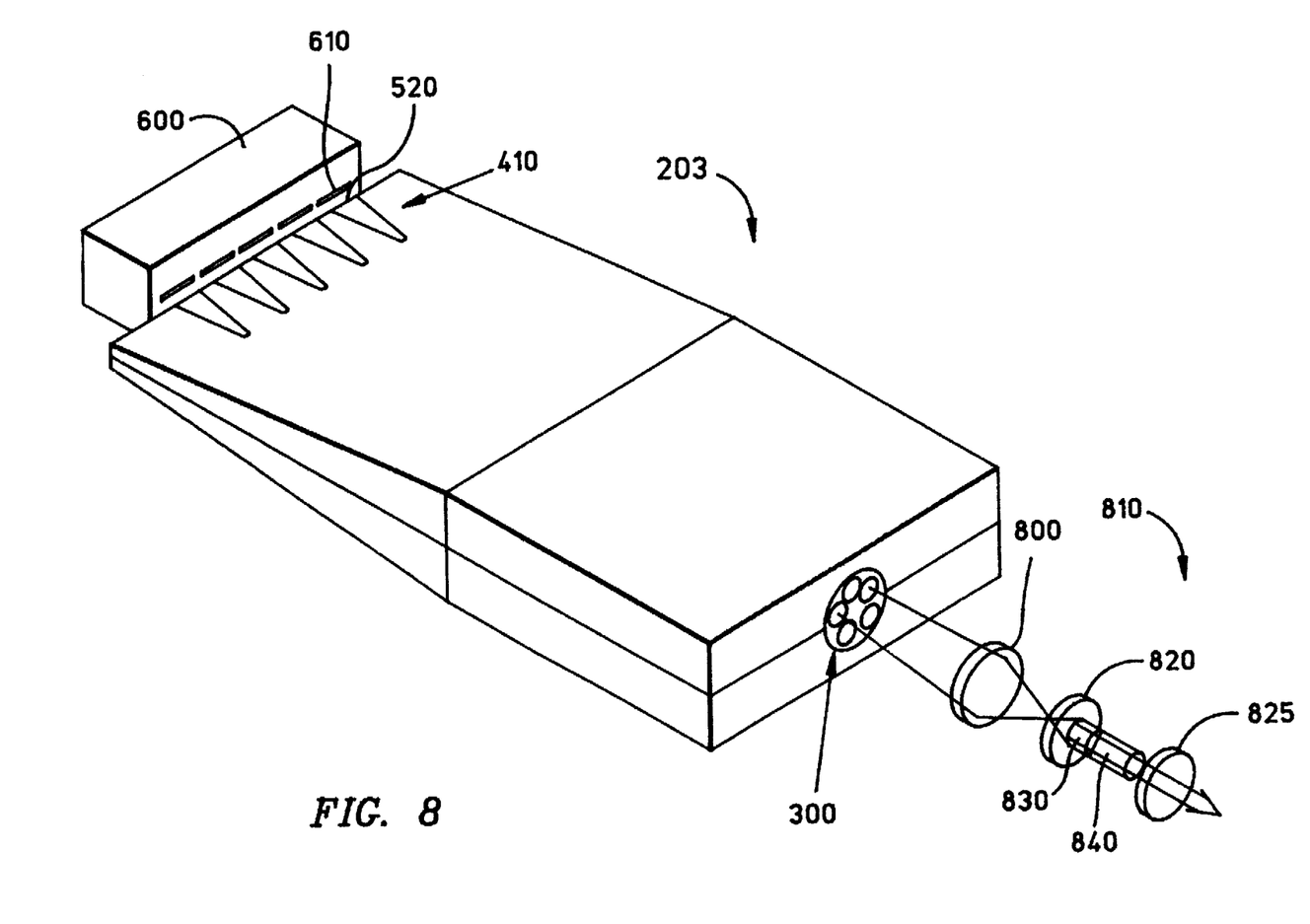
FIG. 8 is a perspective view of a laser diode array coupled by the fiber optic coupler of the invention to end pump a solid state laser.

Reference is now made to FIG. 8 which is a perspective view of a configuration in which the laser diode array 600 is coupled via the coupler of this invention to end pump a solid state laser 810. Particularly, the laser diode array 600 is positioned proximate to the tapered sections 410 in a position to effectively couple the light thereto, and the center-to-center spacing of the coupling facets is arranged to match the center-to-center spacing of the outputs of the diode array. In one embodiment, the output surfaces have the dimensions of 1×200 microns, and the optical fibers within the housing have a cylindrical shape with an unfinished diameter of between 200 and 300 microns. Preferably, each output surface 610 is positioned closely enough to the coupling facet 520 to direct all of the light emitted from the laser diode into the optical fiber, but far enough away to prevent burning the coupling facet and far enough away to avoid feedback (from reflections) into the laser diode. In one implemented embodiment using a 250 micron circular fiber with a laser diode output surface of 1×200 microns, the rectangular coupling facet has a height around 60 to 70 microns, a length of about 250 microns, and the distance between the coupling facet and the laser diode output is approximately two-thirds of the height, or around 45–50 microns with a tolerance of ±25 microns. For optimum coupling, the height of the input facet should be as small as practical and as close to the diode output as possible, without being so close as to sustain damage due to the high power density of the incident beam or to cause undesirable feedback into the diode.

The light coupled from the laser diode 600 is transmitted through the optical fibers in housing 203 and then emitted from the output ends 300 of the optical fibers to provide a collective beam defined by the collection of the separate (but closely positioned) beams from the output facets. These collected beams are applied through a conventional focusing lens 800 into a solid state laser 810 that comprises a laser cavity defined between an input coupler 820 and an output coupler 825. In a common embodiment, the end reflectors (i.e., the input and output couplers) for a solid state laser can be deposited directly on the faces of the solid state gain material. The input coupler 820 is transmissive at the wavelength of the pump beam and reflective at the lasing wavelength. A solid state gain material 830, positioned within the laser cavity, is pumped by the pump beam. An optional frequency doubling crystal 840, or other nonlinear optical material, may be positioned within the laser cavity to transform the wavelength. Preferably, the beam is focused tightly near the input end of the gain material 830 in order to "end pump" the gain material in a conventional manner. The output coupler 825 for a laser is partially reflective at the output wavelength. If a doubling crystal is used, the output coupler is reflective at the lasing wavelength and transmissive at the doubled wavelength.

Figure 9:
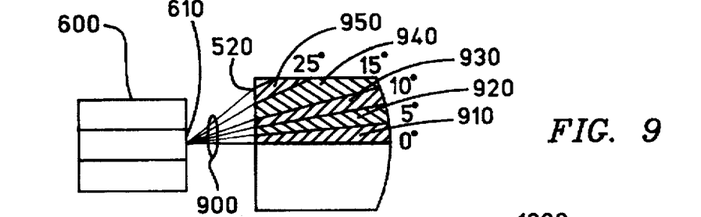
FIG. 9 is an enlarged cross-sectional view of a portion of the coupling embodiment of FIG. 8 depicting one-half of a laser beam emitted from the output surface of the laser diode.

Reference is now made to FIG. 9 which is a cross-section depicting one-half of a laser beam 900 emitted along the fast axis from the output surface 610 of the laser diode 600. In the embodiment of FIG. 5, the beam portion along the slow axis enters between the parallel side sections 522 and 524 and is thereby coupled unchanged in divergence, i.e., its divergence is neither increased nor decreased. Particularly, the cross-section illustrated at 900 is taken along one-half of the beam (the bottom half is not shown because it will be symmetrical) along the fast axis, which is the more rapidly diverging axis of the output beam from the laser diode. The beam 900 enters through the coupling facet 520, which causes the angle of the incoming beam to change by refraction, and the refracted beam is divided into five portions chosen for ease of illustration in the embodiment to be described, in which the half-angle of the taper (the angle between the center line of the fiber and the taper) is 5°. A first beam portion 910 includes all laser radiation emitted between 0° and 5°. A second beam portion 920 is defined between 5° and 10°, a third beam portion is defined between 10° and 15°, a fourth beam portion 940 is defined between 15° and 25°, and a fifth beam portion 950 includes all beam portions whose divergence is greater than 25°.

Figure 10A:
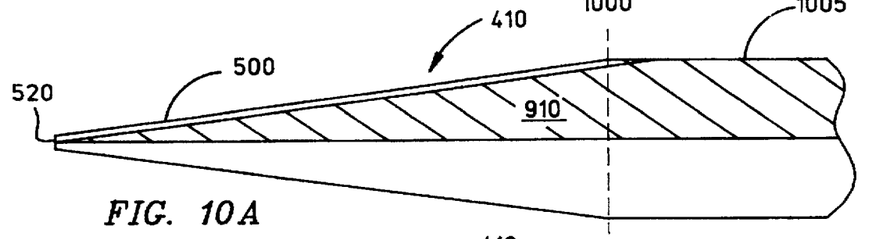
FIG. 10A is an enlarged cross-sectional view illustrating progress of a portion of the input beam that is coupled as shown in FIG. 9 through the coupling facet with an angle between 0° and 5°.

Reference is made to FIGS. 10A–10D, which illustrate the reflections of each of the beam portions as they progress through the coupling facet 520, through the tapered section 410, and through the boundary 1000 defined between the tapered section 410 and a main body 1005 of the fiber. FIG. 10A illustrates the progress of the first beam portion 910, which is between about 0° and 5°. Because in the first portion about 5° is the maximum divergence, which is equivalent to the taper half-angle ($\alpha$) in this example, then no reflections occur at the upper tapered surface 500. Therefore, the first portion 910 is launched into the main body 1005 at no more than a 5° angle and thereafter bounces at a maximum of 5° through the remainder of the fiber.

Figure 10B:
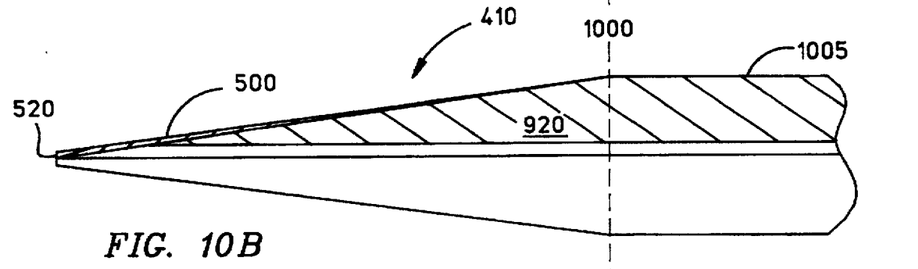
FIG. 10B is a cross-sectional view similar to FIG. 10A of the beam portion at an angle between 5° and 10° that is reflected once off the first tapered surface.

FIG. 10B illustrates the second portion 920, which is defined between about 5° and 10°, being reflected one time from the upper tapered surface 520 and then progressing therefrom. At just above 5°, the angle is very slight and little angle reduction occurs. However, at 10° the divergence angle is reduced by reflection down to 0°, which is parallel with the axis of the fiber. Thus, a second portion 920 is launched into the main body 1005 at no more than a 5° angle and thereafter is transmitted at a maximum of 5° divergence through the remainder of the fiber.

Figure 10C:
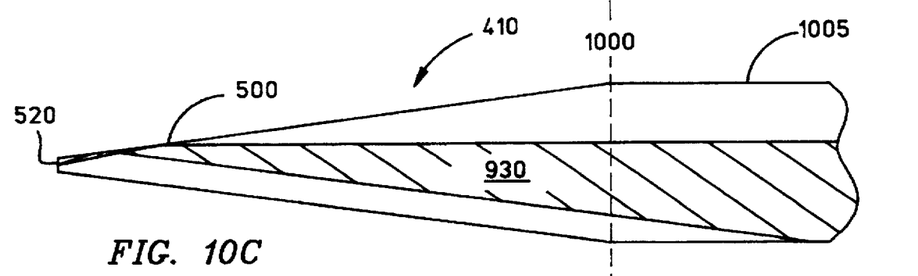
FIG. 10C is an illustration similar to FIG. 10A of the beam at an angle between 10° and 15° that is reflected once from the first tapered surface.

FIG. 10C illustrates progress of the third portion 930, which is between about 10° and 15°. This portion will be reflected only once from the surface 500, but will proceed at a maximum of −5° from its original entry point. Thus, the third portion 910 is launched into the main body 1005 at no more than a 5° angle. Particularly, the 10° portion is reduced in divergence to 0° and the 15° portion is reduced to −5°.

Figure 10D:
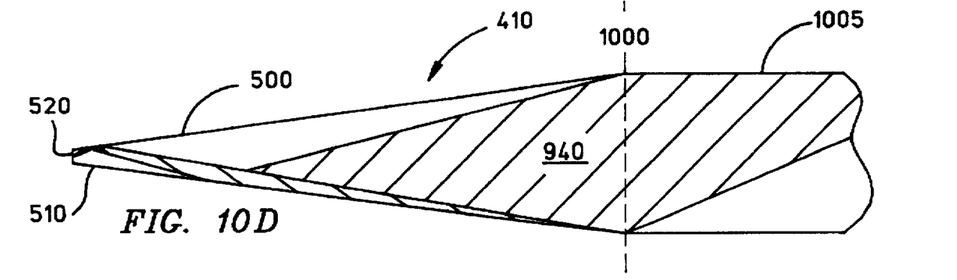
FIG. 10D is a depiction similar to FIG. 10A of progress of the fourth portion of the beam, at an angle between 15° and 25°, that is reflected twice before being launched into the main body of the fiber optic cable.

FIG. 10D illustrates progress of the fourth portion of the beam 940 which is between about 15° and 25°. The beam is reflected first off of the upper surface 500 and then the reflected beam is reflected off of the lower surface 510. The beam reflected off of the second surface 510 will be launched into the main body 1005 at an angle not greater than 5° from the center axis of the fiber, from where it will then continue to bounce back and forth.

The fifth portion 950 will be reflected multiple times, dependent upon its divergence. Particularly, this fifth portion will bounce at least three times, four times for more highly divergent angles, and even more times for even higher angles of divergence. Generally, the higher the angle of divergence, the more the number of reflections that will occur before it is launched into the main body 1005. As a result of these multiple reflections, the divergence angle is reduced upon each reflection, with the result that the fifth portion of the beam will also be launched into the main body 1005 at an angle not greater than 5°.

To better understand the behavior of light entering the tapered end of each fiber, the following example presents an analysis of a laser diode beam in which the half angle with the fast axis of the diode is about 42.9°. The analysis herein is somewhat different from that discussed with the reference to FIGS. 9 and 10A–D. For this discussion, the radiation emitted by the diode is divided into three components. Before entering the fiber, the first component falls within a half angle of about 11.6° relative to the axis of the fiber, while the second and third components encompass half angles extending from about 11.6° to 26.6° and from about 26.6° to 42.9°, respectively.

Radiation entering a non-tapered fiber having a numerical aperture of 0.2 at angles up to 11.6° cannot escape from a fiber. Hence, all rays within the first component of the three-component beam are trapped within the fiber independent of whether or not they encounter a tapered surface during passage into the main cylindrical portion of the fiber. Upon entering the fiber, refraction causes the extreme ray of this component to have its propagation angle reduced to about 8°. For purposes of illustration, the half angle of the fiber taper is set at about 5°. Thus, this extreme ray intersects the tapered surface of the fiber at an incident angle of 87°, resulting in total internal reflection. Subsequent to reflection, the same ray continues down the fiber at an angle of 2° relative to the fiber axis.

Radiation associated with the second component (i.e., that entering at angles between 11.6° and 26.6°) undergoes at least one reflection at a tapered surface prior to entering the cylindrical section of the fiber. Immediately upon entering the fiber end face, the refracted angles of propagation associated with this second component range from about 8° to 18°. This results in angles of incidence at the tapered surface that range from about 87° to 77°, respectively. Subsequent to reflection at this surface, the angles of propagation relative to the fiber axis fall within the range about 2° to −8°, thereby requiring no further reduction prior to entering the cylindrical portion of the fiber.

Radiation of the third component (i.e., that entering at angles between about 26.6° and 42.9°) undergoes at least two reflections at the tapered surface prior to entering the cylindrical section of the fiber. Upon entering the fiber end face, the refracted angles of propagation for this third component range from about 18° to 28°. At their first interaction with a tapered surface, the corresponding angles of incidence range from about 77° to 67°, respectively. Upon one reflection, this range of angles becomes about 87° to 77°, i.e., identical to that of the second component prior to reflection. Consequently, after a second reflection at the opposing tapered surface, this third component also is reduced in numerical aperture such that it becomes trapped within the cylindrical portion of the fiber.

The numerical example presented above is used only to illustrate the behavior of radiation entering a device of the type described. Aspects of the approach which can be subject to significant variance relative to the example given include the numerical aperture of the fiber, the input half-angle, the taper half-angle, the ratio of input face height to fiber diameter and the number of internal reflections which occur prior to entry into the cylindrical portion of the fiber.

A tapered fiber optic coupler having geometric characteristics similar to that of the numerical example used above has been built and tested with a laser diode array having twenty individual laser emitters. The entrance and exit faces of the fiber array were anti-reflection coated both to minimize feedback to the diode and to maximize throughput efficiency. For purposes of coupling the final output to a microlaser, the far end of the fiber optical coupling device was terminated in a close packed circular array. The length of the coupler was approximately seven centimeters. At ten watts of collective CW laser power, the efficiency with which power was collected from the laser diode array, transmitted through the fibers and emitted from the output facets was measured to be greater than 98%. Meanwhile, the extent to which the polarization of the diode output was preserved was measured to be about 91%.

Figure 11:
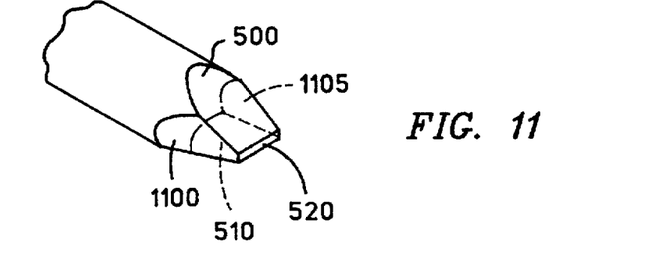
FIG. 11 is an alternative embodiment of the invention showing a fiber optic coupler in which third and fourth tapered surfaces are formed adjacent to the first and second tapered surfaces.

Reference is now made to FIGS. 11–14, which illustrate alternative embodiments of the tapered section of a fiber. In the embodiment shown in FIG. 5, a first upper surface 500, a lower tapered surface 510 and a coupling facet 520 are provided on the tapered section 410. In that embodiment, the angle α of the upper tapered section 500 was equal to the angle α of the lower tapered section. FIG. 11 is a variation of the embodiment shown in FIG. 5, where a third tapered surface 1100 is formed perpendicular to the upper and lower tapered sections, and a fourth tapered surface 1105 is formed directly opposite the third tapered surface 1100 in a position perpendicular to and between the upper and lower tapered surfaces 500 and 510. The embodiment in FIG. 11 may be termed a "quad taper", and is useful for reducing the angle of divergence along the slow axis.

Figure 12:
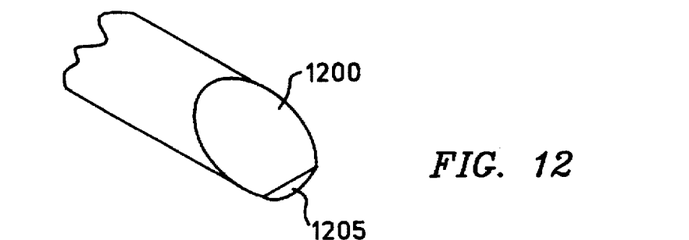
FIG. 12 is another alternative embodiment of the invention with the fiber optic coupler comprising a single taper.

In comparison with the quad taper of FIG. 11, a "single-taper" embodiment is shown in FIG. 12, in which a cylindrical fiber is tapered to provide a single tapered surface 1200. A coupling facet 1205 is defined by the remaining portion of the end of the fiber.

Figure 13:
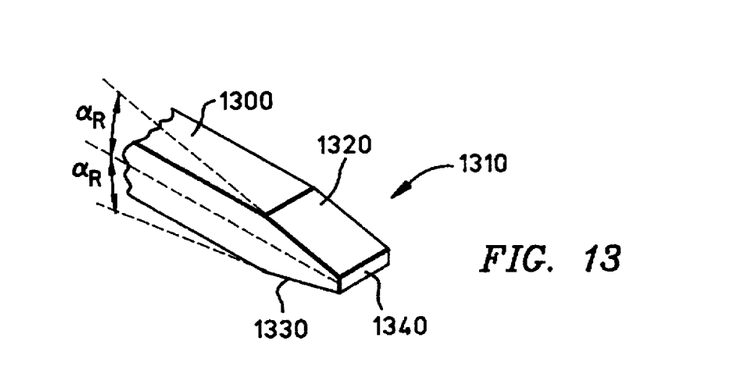
FIG. 13 is a further alternative embodiment of the invention where the fiber optic coupler is a rectangular fiber having dual tapered surfaces formed thereon.

FIG. 13 is an embodiment in which a rectangular fiber 1300 is formed to have a tapered section 1310 that includes an upper tapered surface 1320 at a predetermined angle α and a lower tapered surface 1330, also at the predetermined angle 0% A rectangular coupling facet 1340 is provided between the two, approximately flat rectangular tapered surfaces 1320 and 1330. It is believed that a rectangular fiber will have excellent polarization preservation properties. Furthermore, the double tapered embodiment of FIG. 13 can be easily formed within the housing as described earlier. Other advantages of using a rectangular, and particularly a square, fiber is that it can be closely packed at the output side to provide a closely positioned output beam. Furthermore, the square fiber is particularly useful for the "single taper" embodiment. Forming only a single taper reduces costs and, because one side of the square fiber is already flat, more coupling efficiency is possible than with the single taper formed from a circular fiber.

Figure 14:
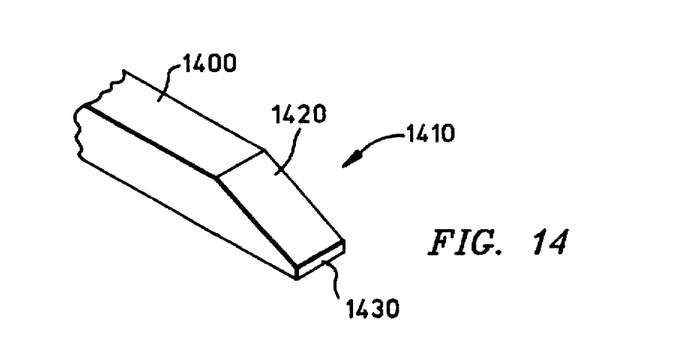
FIG. 14 is yet another alternative embodiment of the invention showing the fiber optic coupler having a rectangular fiber with a single tapered surface formed thereon.

FIG. 14 is a perspective view of a rectangular fiber 1400 that has a single taper section 1410 including an approximately flat rectangular shaped tapered surface 1420 formed on only one side of the rectangular fiber. A coupling facet 1430 is provided by the remaining portion of the end of the fiber.

As described previously, the taper angle can advantageously be provided between about 2° and 8°. Generally, as the taper angle gets progressively smaller, it advantageously reduces the solid angle of radiation transmitted to the main body of the fiber. However, production costs for the low-angle tapered surface become progressively higher, and at some point (below 2°) it becomes nearly impossible to produce. Furthermore, reducing the beam's solid angle (i.e. reducing the numerical aperture) below the NA of the fiber would likely not be beneficial, insofar as the divergence of light transmitted through a fiber of any significant length will increase to match the NA of the fiber. Above about 8° the resulting large solid angle of the beam begins to introduce losses in the fiber optic cable, thereby reducing coupling efficiency, with the result that the output has less brightness. A particularly preferred range of taper angles is between about 4° and 6°.

Other embodiments and modifications of this invention may occur to those of ordinary skill in the art in view of these teachings. Therefore, this invention is to be limited only by the following claims, which include all such embodiments and modifications when viewed in conjunction with the above specification and accompanying drawing figures.

What is claimed is:

1. A fiber optic coupler for a laser diode that provides an asymmetrical beam including rapidly diverging laser radiation and slowly diverging laser radiation, comprising:

at least one fiber optic cable having:
  a first end including a tapered section having an approximately flat coupling facet for receiving said asymmetrical beam, an approximately flat tapered surface adjacent to said coupling facet for reflecting said rapidly diverging laser radiation, and a second approximately flat tapered surface extending from said coupling facet and situated opposite said first tapered surface;
  a main body for receiving and transmitting said reflected laser radiation and said slowly diverging laser radiation; and
  a second end for outputting said transmitted laser radiation from the fiber optic cable; and a support structure for situating the coupling facet proximate to said laser diode.

2. The fiber optic coupler of claim 1 wherein said second end of said at least one fiber optic cable includes an approximately flat output facet.

3. The coupler of claim 1, wherein said tapered section further comprises a first side section and a second side section situated between said first and second tapered surfaces, so that said first and second side sections are approximately parallel with the central axis of said fiber optic cable.

4. The coupler of claim 1, wherein said tapered section further comprises a third, approximately flat tapered surface and an oppositely positioned fourth, approximately flat tapered surface situated between said first and second tapered surfaces.

5. The fiber optic coupler of claim 1, wherein said first tapered surface and said second tapered surface define approximately equal angles with respect to the central axis of said fiber optic cable.

6. The coupler of claim 1, wherein said fiber optic cable has a circular cross-section.

7. The coupler of claim 1, wherein said fiber optic cable has a rectangular cross-section.

8. The coupler of claim 1, wherein said fiber optic cable has an approximately square cross-section.

9. A fiber optic coupler for a laser diode array having a plurality of outputs each providing an asymmetrical beam having a fast axis and a slow axis, comprising:
    a plurality of fiber optic cables each having:
        a first end including tapered section having an approximately flat coupling facet for receiving a predetermined one of said plurality of asymmetrical beams, an approximately flat tapered surface adjacent to said coupling facet, and a second approximately flat tapered surface extending from said coupling facet and situated opposite said first tapered surface;
        a main body for transmitting laser radiation; and
        a second end for outputting said transmitted laser radiation; and
    a support structure for situating each of said coupling facets in a first predetermined configuration proximate to said laser diode array, so that the fast axis of each of the plurality of asymmetrical output beams from the laser diode array is aligned approximately perpendicular with the flat tapered section.

10. The coupler of claim 9, wherein said fiber optic cables have a circular cross-section.

11. The coupler of claim 9, wherein said fiber optic cables have a rectangular cross-section.

12. The coupler of claim 11, wherein said fiber optic cables have an approximately square cross-section.

13. The fiber optic coupler of claim 9 wherein said second end of said plurality of fiber optic cables includes an approximately flat output facet.

14. The coupler of claim 9, wherein said first tapered surface and said second tapered surface define approximately equal angles with respect to the central axis of said fiber optic cable.

15. The coupler of claim 9, wherein said tapered section further comprises a first side section and a second side section situated between said first and second tapered surfaces, so that said first and second side sections are approximately parallel with the central axis of said fiber optic cable.

16. The coupler of claim 9, wherein said tapered section further comprises a third, approximately flat tapered surface and an oppositely positioned fourth, approximately flat tapered surface situated between said first and second tapered surfaces.

17. The coupler of claim 9, and further comprising an anti-reflection dielectric coating formed on said coupling facet.

18. A fiber optic coupler for a laser diode array having a plurality of outputs each providing an asymetrical beam having a fast axis and a slow axis, comprising:
    a plurality of fiber optic cables each having:
        a first end including tapered section having an approximately flat coupling facet for receiving a predetermined one of said plurality of asymetrical beams and an approximately flat tapered surface adjacent to said coupling facet;
        a main body for transmitting laser radiation; and a second end for outputting said transmitted laser radiation; and
    a support structure for situating each of said coupling facets in a first predetermined configuration proximate to said laser diode array, so that the fast axis of each of the plurality of asymetrical output beams from the laser diode array is aligned approximately perpendicular with the flat tapered section, wherein said support structure comprises a housing, said housing comprising:
        an input end that situates said coupling facets and said adjacent tapered sections in a first predetermined configuration proximate to said outputs from the laser diode array; and
        an output end that situates said second end in a second predetermined configuration.

19. The coupler of claim 18, wherein in said second predetermined configuration, said second ends are situated in a closely positioned adjacent relationship.

20. The coupler of claim 19, wherein said plurality of fiber optic cables have an approximately circular cross-section and said second predetermined configuration comprises an approximately circular shape within which said second ends are situated.

21. The coupler of claim 18, wherein said second ends are situated in a closely positioned adjacent relationship within said housing to provide a collective output beam, and further comprising:
    a solid state laser including a laser cavity and a solid state gain material situated therein; and
    means for applying said collective output beam to end-pump said solid state gain material and thereby provide lasing operation of said solid state laser.

22. A source of laser radiation comprising:
    a laser diode having an output surface that provides an asymmetrical beam having a fast axis and a slow axis;
    at least one fiber optic cable having:
        a first end including a tapered section having an approximately flat coupling facet situated for receiving said asymmetrical beam, a first approximately flat tapered surface, and a second approximately flat tapered surface extending from said coupling facet and situated opposite said first tapered surface;
        a main body adjacent to said tapered surface for receiving and transmitting laser radiation; and
        a second end for outputting the laser radiation transmitted through said main body of said fiber optic cable; and
    a support structure for situating said coupling facet proximate to said laser diode so that the fast axis is aligned substantially perpendicular with said flat tapered surface.

23. The coupler of claim 22, wherein said fiber optic cable has a circular cross-section.

24. The coupler of claim 22, wherein said tapered section further comprises a first side section and a second side section situated between said first and second tapered surfaces, so that said first and second side sections are approximately parallel with the central axis of said fiber optic cable.

25. The coupler of claim 22, wherein said tapered section further comprises a third, approximately flat tapered surface and an oppositely positioned fourth, approximately flat tapered surface situated between said first and second tapered surfaces.

26. The fiber optic coupler of claim 22, wherein said first tapered surface and said second tapered surface define approximately equal angles with respect to the central axis of said fiber optic cable.

27. The coupler of claim 22, wherein said fiber optic cable has a rectangular cross-section.

28. The coupler of claim 27, wherein said fiber optic cable has an approximately square cross-section.

29. A source of laser radiation comprising:
  a laser diode having an output surface that provides an asymmetrical beam having a fast axis and a slow axis;
  at least one fiber optic cable having:
    a first end including a tapered section having an approximately flat coupling facet situated for receiving said asymmetrical beam, and including a first approximately flat tapered surface and an oppositely positioned second approximately flat tapered surface positioned adjacent to said coupling facet, and a first side section and an oppositely positioned second side section situated between said first and second tapered sections so that said first and second side sections are approximately parallel with the central axis of said fiber optic cable, said tapered sections being aligned so that the fast axis is aligned substantially perpendicular to said first and second flat tapered surfaces;
    a main body adjacent to said tapered surface for receiving and transmitting laser radiation; and
    a second end including an approximately flat output facet for outputting the laser radiation transmitted through said main body of said fiber optic cable; and
  a support structure for situating said coupling facet proximate to said laser diode so that the fast axis is aligned substantially perpendicular with said flat tapered surface and the slow axis is aligned substantially perpendicular to said first and second side sections.

30. The laser radiation source of claim 29, wherein said first tapered surface and said second tapered surface define approximately equal angles with respect to the central axis of said fiber optic cable.

31. The laser radiation source of claim 29, wherein said at least one fiber optic cable has a circular cross-section.

32. The laser radiation source of claim 29, wherein said at least one fiber optic cable has a rectangular cross-section.

33. The laser radiation source of claim 32 wherein said at least one fiber optic cable has an approximately square cross-section.

34. A method of making a fiber optic coupler comprising the steps of:
  a) providing at least one fiber optic cable;
  b) providing a housing for enclosing the cable between an upper section of the housing and a lower section of the housing;
  c) enclosing the cable within the housing so that a first cable end extends from a first side of the housing and a second cable end extends from a second side of the housing;
  d) tapering the first end of the fiber optic cable at a predetermined angle so that the cable has a tapered section that includes first and second approximately flat tapered surfaces and an approximately flat coupling facet on the end, including forming the first, approximately flat, tapered surface extending from the coupling facet at said predetermined angle and forming the second, approximately flat, tapered surface situated approximately opposite said first tapered surface, extending from the coupling facet; and
  e) forming the second end of the fiber optic cable to provide an output end.

35. The method of claim 34 wherein said step (e) includes polishing the output end of the at least one fiber optic cable to provide an approximately flat output facet.

36. The method of claim 34, wherein said tapering in step (d) further includes grinding and polishing the housing together with the fiber optic cable at the predetermined angle so that the housing and cable define an approximately flat tapered surface.

37. The method of claim 34, wherein said step (e) further includes the step of grinding and polishing the second end of the housing together with the fiber optic cable so that the output facets of the cable and the second end of the housing define an approximately flat surface.

38. The method of claim 34, and comprising the further step of depositing an anti-reflection dielectric coating on the coupling facets of the optical fibers.

39. The method of claim 34, wherein said tapering step includes forming said second tapered surface at said predetermined angle.

40. A method of making a fiber optic coupler comprising the steps of:
  a) providing a plurality of fiber optic cables;
  b) providing a housing for enclosing the cables between an upper portion of the housing and a lower portion of the housing;
  c) enclosing the cables within the housing so that each has a first cable end that extends from a first side of the housing and a second cable end that extends from a second side of the housing;
  d) tapering the first ends of the fiber optic cables at a predetermined angle so that the cable has a tapered section that includes an approximately flat tapered first surface, an approximately flat coupling facet on the end and a second approximately flat surface opposite said first surface; and
  e) forming the second ends of the fiber optic cables to provide an output end.

41. The method of claim 40, wherein said step (e) further includes the step of grinding and polishing the second end of the housing together with the fiber optic cable so that the output facets of the cable and the second end of the housing define an approximately flat surface.

42. The method of claim 40, wherein said step (c) includes aligning the first ends in an approximately linear configuration.

43. The method of claim 40, wherein said step (c) includes closely positioning the output ends of the fiber optic cables in an adjacent relationship to provide a geometrically compact pupil.

44. The method of claim 40, and comprising the further steps of:
  providing a laser diode array that has a plurality of outputs, each output supplying an asymmetrical laser beam having a fast axis and a slow axis; and
  aligning the coupling facets and the housing so that the coupling facets of the fiber optic cable are situated with respect to the laser diode outputs to receive the asymmetrical laser beam with the fast axis approximately perpendicular to the tapered surface.

45. The method of claim 44, wherein said step (c) includes closely positioning the output ends of the fiber optic cables in an adjacent relationship to provide a geometrically compact pupil that provides a collective output beam from the output facets to end-pump the solid state gain material.

46. The method of claim 40, wherein said tapering in said step (d) further comprises grinding and polishing the housing together with the fiber optic cable at the predetermined angle.

47. A method for coupling an asymmetrically diverging laser beam into a fiber optic cable using an integrally-formed coupler having a flat, substantially rectangular, coupling facet and an approximately flat tapered section including a first approximately flat tapered surface and a second approximately flat surface positioned opposite to said first flat surface, comprising the steps of:

providing an asymmetrically diverging laser beam that defines a fast axis and a slow axis;

coupling said asymmetrically diverging laser beam through the coupling facet on the integrally-formed coupler in an alignment with the width of the facet aligned with the fast axis and the length of the facet aligned with the slow axis;

reflecting a portion of the beam diverging along the fast axis from the first approximately flat tapered surface and the second approximately flat surface positioned opposing said first flat surface in the tapered section of the integrally-formed coupler to reduce the angle of divergence along the fast axis; and transmitting said beam through the fiber optic cable with the fast axis having a reduced divergence and the slow axis having a substantially unchanged divergence.

48. The method of claim 47, and comprising the further step of generating said asymmetrically diverging laser beam by operating a laser diode having an approximately rectangular output surface.

49. The method of claim 47, and comprising the further step of further reflecting a portion of said twice-reflected beam one or more times from said first and second flat surfaces.

50. The method of claim 47, and comprising the further steps of:

outputting the reduced-angle beam from an output end of the fiber optic cable to provide a pump beam; and applying said pump beam to end-pump a solid state gain material positioned within an optical cavity.

51. The method of claim 47, and comprising the further step of applying said pump beam from the output end of the fiber optic cable into a focusing lens positioned to focus said pump beam into said solid state gain material.

* * * * *